(12) United States Patent
Yun

(10) Patent No.: US 8,349,639 B2
(45) Date of Patent: Jan. 8, 2013

(54) METHOD FOR MANUFACTURING IMAGE SENSOR

(75) Inventor: Ki-Jun Yun, Suwon-si (KR)

(73) Assignee: Dongbu HiTek Co., Ltd., Seoul (KR)

( * ) Notice: Subject to any disclaimer, the term of this patent is extended or adjusted under 35 U.S.C. 154(b) by 346 days.

(21) Appl. No.: 12/615,088

(22) Filed: Nov. 9, 2009

(65) Prior Publication Data

US 2010/0120189 A1 May 13, 2010

(30) Foreign Application Priority Data

Nov. 11, 2008 (KR) .................. 10-2008-0111418

(51) Int. Cl.
*H01L 31/042* (2006.01)
*H01L 31/068* (2012.01)
(52) U.S. Cl. .......... 438/73; 438/639; 438/640; 438/672; 438/696; 438/719; 257/E21.219; 257/E21.234; 257/E21.578; 257/E21.585
(58) Field of Classification Search ............... 438/57, 438/672, 696, 73, 639, 640, 719; 257/E21.219, 257/E21.234, E21.577, E21.585
See application file for complete search history.

(56) References Cited

U.S. PATENT DOCUMENTS

| | | | |
|---|---|---|---|
| 5,851,302 A * | 12/1998 | Solis | 134/1.2 |
| 5,976,986 A | 11/1999 | Naeem et al. | |
| 2009/0114964 A1* | 5/2009 | Han | 257/292 |
| 2009/0163021 A1* | 6/2009 | Ryu | 438/636 |
| 2010/0015746 A1* | 1/2010 | Park | 438/57 |
| 2010/0117173 A1* | 5/2010 | Yun et al. | 257/431 |
| 2010/0117174 A1* | 5/2010 | Jung | 257/431 |
| 2010/0117179 A1* | 5/2010 | Kim | 257/432 |
| 2010/0117184 A1* | 5/2010 | Jung | 257/461 |
| 2010/0164047 A1* | 7/2010 | Yun | 257/458 |

FOREIGN PATENT DOCUMENTS

KR 10-2006-0120260 11/2006

\* cited by examiner

*Primary Examiner* — Mary Wilczewski
*Assistant Examiner* — Toniae Thomas
(74) *Attorney, Agent, or Firm* — Sherr & Jiang, PLLC

(57) ABSTRACT

A method for manufacturing an image sensor includes forming circuitry including a metal line over a semiconductor substrate, forming a photodiode over the metal line, and forming a contact plug in the photodiode such that the contact plug is connected to the metal line. The forming of the contact plug includes performing a first etch process to etch a portion of the photodiode, and performing a second etch process to expose a portion of the metal line by using a byproduct generated in etching, to form a via hole for the contact plug in the photodiode.

20 Claims, 4 Drawing Sheets

METHOD FOR MANUFACTURING IMAGE SENSOR

Figure 1:
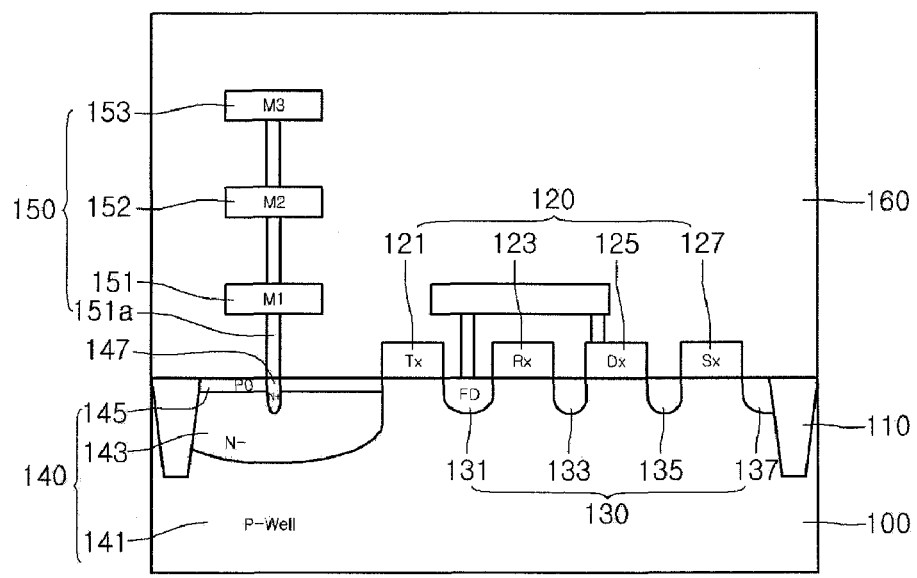

The present application claims priority under 35 U.S.C. 119 to Korean Patent Application No. 10-2008-0111418 (filed on Nov. 11, 2008), which is hereby incorporated by reference in its entirety.

BACKGROUND

CMOS image sensors according to the related art have a structure in which a photodiode and transistors are horizontally disposed. Although disadvantages of CCD image sensors have been overcome in horizontal CMOS image sensors according to the related art, unsolved problems still remain with horizontal CMOS image sensors.

In horizontal CMOS image sensors according to the related art, the photodiode and the transistor are horizontally adjacent to each other on a substrate. Thus, an area for the photodiode is required in addition to the area for the transistors. This reduces "fill factor", and limits resolution capabilities.

In horizontal CMOS image sensors according to the related art, it is also very difficult to optimize a process of simultaneously manufacturing the photodiode and the transistor. In particular, a shallow junction is required for low sheet resistance in a rapid transistor process. However, such shallow junction is unsuitable for the photodiode.

In horizontal CMOS image sensors according to the related art, if on-chip functions are added to the CMOS image sensor, the size of a unit pixel must be increased in order to maintain the sensitivity of the image sensor, or the area of the photodiode must be reduced in order to maintain the size of a pixel. However, if the size of the unit pixel is increased, the resolution of the image sensor may be reduced. If the area of the photodiode is reduced, the sensitivity of the image sensor may be reduced.

SUMMARY

Embodiments relate to a method for manufacturing an image sensor capable of improving integration of circuitry and photodiodes. Embodiments relate to a method for manufacturing an image sensor, capable of forming a photodiode by employing two chips. The two chips are divided into an image chip, including a color-filter array and a micro-lens, and a logic chip, having a driver IC for driving the image chip and a logic array for other additional functions. The two chips joined to each other by 3-D integration into a single pad.

Embodiments relate to a method for manufacturing an image sensor, capable of eliminating a plurality of metal lines from an upper portion of a photodiode, so that the distance between a photodiode and a micro-lens can be reduced. The method significantly reduces an optical path, thereby improving light sensitivity.

To improve a light receiving capability of the photodiode, the area for the photodiode must be increased, or the size of a via hole passing through the photodiode must be reduced. If the size of the via hole is excessively small, the entrance of the via hole may be clogged during formation of a barrier pattern in a portion of a doping region of the photodiode. Accordingly, embodiments teach a method for manufacturing an image sensor, capable of reducing the size of the via hole while maintaining the entrance of the via hole in an open state even if the barrier pattern is formed.

According to embodiments, a method for manufacturing an image sensor may include forming circuitry including a metal line over a semiconductor substrate, forming a photodiode over the metal line, and forming a contact plug in the photodiode such that the contact plug is connected to the metal line. The forming of the contact plug includes performing a first etch process to etch a portion of the photodiode, and performing a second etch process to expose a portion of the metal line by using a byproduct generated in etching, in order to form a via hole for the contact plug in the photodiode.

According to embodiments, a method for manufacturing an image sensor may include forming a photodiode including a first impurity region and a second impurity region over the first impurity region in a substrate, which is aligned over an interlayer dielectric layer having a metal line, through an ion implantation process, exposing a portion of the second impurity region of the photodiode by etching the photodiode, forming a barrier layer over the photodiode such that the barrier layer insulates the second impurity region, exposing a portion of the metal line by etching the photodiode and the interlayer dielectric layer, and forming a contact plug in the photodiode such that the contact plug is electrically connected to the metal line. The portion of the metal line is exposed through a BCM process using a byproduct generated in etching process.

DRAWINGS

Example FIGS. 1 to 7 are views showing a method for manufacturing an image sensor according to embodiments.

DESCRIPTION

Example FIGS. 1 to 7 are views showing a method for manufacturing an image sensor according to an embodiment.

As shown in example FIG. 1, a substrate 100 provided thereon with a metal line 150 and a circuitry 120 may be prepared. For example, an isolation layer 110 may be formed in the first substrate 100 having a second conductive type to define an active region, and the circuitry 120 including transistors is formed in the active region.

For example, the circuitry 120 may include a transfer transistor (Tx) 121, a reset transistor (Rx) 123, a drive transistor (Dx) 125, and a select transistor (Sx) 127. Thereafter, an ion implantation region 130 including a floating diffusion region (FD) 131 and source/drain regions 133, 135, and 137 may be formed.

When the circuitry 120 is formed over the first substrate 100, an electric junction region 140 may be formed over the first substrate 100, and a first conductive-type region 147, which may be heavily doped, may be formed at an upper portion of the electric junction region 140 such that the first conductive-type region 147 is connected to the metal line 150. For example, the electric junction region 147 may be a PN junction region, but embodiments are not limited thereto.

For example, the electric junction region 140 may include a second conductive-type well 141, a first conductive-type ion implantation layer 143 formed over a second conductive type epitaxial layer, and a second conductive-type ion implantation layer 145 formed over the first conductive-type ion implantation layer 143. Also, for example, the PN junction region 140 may be a P0 145/N− 143/P− 141 junction region as shown in example FIG. 1, but embodiments are not limited thereto. Reasons for forming the P0/N−/P− junction region 140 over the Si substrate 100 to act as a photodiode are as follows.

According to embodiments, different from the FD node 131 having an N+ junction; the P0/N−/P− junction region 140 delivers only a portion of applied voltage and is pinched off at a predetermined voltage. This voltage for the pinch-off is called pinning voltage, and the pinning voltage depends on the doping concentration of the P0 layer 145 and the N− layer 143.

In particular, electrons generated from a photodiode 200 are moved into the P0/N−/P− junction region 140. When the Tx 121 is turned on, the electrons are delivered into the FD node 131 so that the electrons may be converted into voltage.

Since the maximum voltage of the P0/N−/P− junction region 140 becomes the pinning voltage, and the maximum voltage of the FD node 131 is threshold voltage (Vth) the Vdd-Rx 123, electrons generated from the photodiode 210 positioned above a chip can be fully dumped into the FD node 131 without charge sharing due to potential difference between both terminals of the Tx 131. According to embodiments, unlike the N+ junction, problems of saturation signals and sensitivity degradation can be avoided.

According to embodiments, the N+ layer 147 must be formed over the surface of the P0/N−/P− junction region 140 for the purpose of ohmic contact. However, the N+ layer 147 may be a leakage source. Also, according to embodiments, to minimize the leakage source, the area of the N+ layer 147 can be minimized by performing a plug implant process after an etch process for a first metal contact 151a has been performed. This may reduce dark current of a vertical-type 3-D integrated CIS.

Next, after an interlayer dielectric layer 160 has been formed over the first substrate 100, the metal line 150 may be formed over the resultant structure. The metal line 150 may include the first metal contact 151a, a first metal 151, a second metal 152, a third metal 153, but embodiments are not limited thereto.

Figure 2:
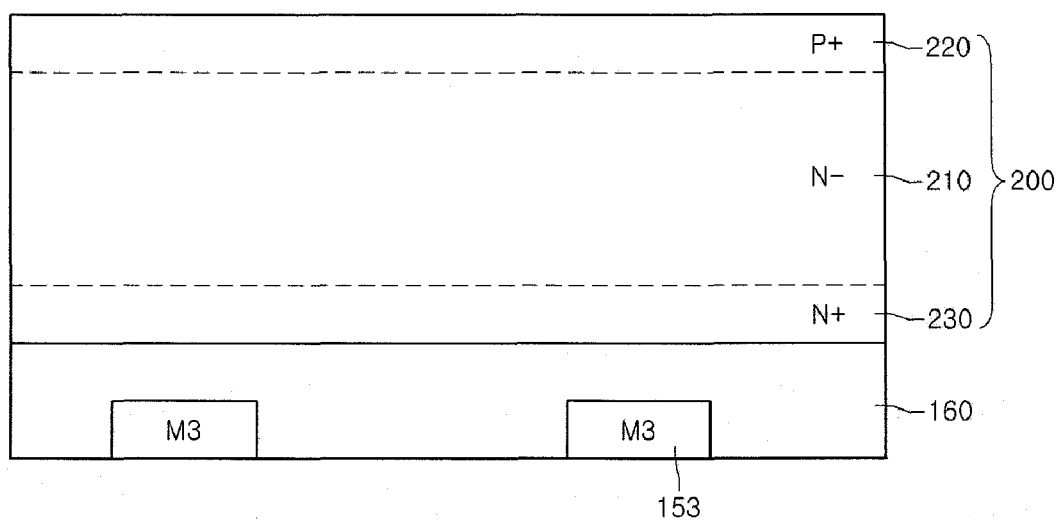

Thereafter, referring to example FIG. 2, a crystalline semiconductor layer may be formed over a second substrate. The photodiode 200 may be formed over the crystalline semiconductor layer, so that defects can be prevented in the photodiode 200.

For reference, the third metal 153 of the metal line 150 and the interlayer dielectric layer 160 shown in example FIG. 2 represents a portion of the metal line 150 and the interlayer dielectric layer 160 shown in example FIG. 1. As shown in example FIG. 2, for the purpose of convenience, the circuitry 120 and a portion of the circuitry 150 are omitted.

Hereinafter, description will be made regarding a process of forming the photodiode 200 over the interlayer dielectric layer 160 of the first substrate 100. The photodiode 200 may have a PN junction structure including a first doped layer (N− layer) 210 and a second doped layer (P+ layer) 220. In addition, an ohmic contact layer (N+ layer or a third doped layer) 230 may be formed under the first doped layer 210.

For example, in order to form the photodiode 200, the first doped layer 210 may be formed by implanting first impurities (e.g., N-type impurities (N−)) into the second substrate having a crystalline structure, and the second doped layer 220 may be formed by implanting second impurities (e.g., P-type impurities (p+)) into the second substrate.

The ohmic contact layer 230 may be formed by implanting high-concentration N-type impurities (N+) corresponding to the first impurities into a lower portion of the first doped layer 210. The ohmic contact layer 230 may reduce contact resistance between the photodiode 200 and the metal line 150.

According to embodiments, the first doped layer 210 may have an area wider than that of the second doped region 220. In this case, a depletion region of the photodiode 200 is expanded so that the generation of photo charges is increased.

Next, after the ohmic contact layer 230 of the second substrate has been placed over the upper portion of the interlayer dielectric layer 160, the first substrate 100 may be bonded with the second substrate through a bonding process. Thereafter, the second substrate having a hydrogen layer may be removed through a cleaving process such that the photodiode 200, which has been bonded with the interlayer dielectric layer 160, is exposed. Accordingly, the surface of the second doped layer 220 can be exposed.

Therefore, the photodiode 200 may be formed over the circuitry 120 so that a fill factor can be increased and the photodiode 200 can be prevented from being malformed. Since the photodiode 200 may be bonded with the interlayer dielectric layer 160 with a uniform surficial profile, the bonding strength between the photodiode 200 and the interlayer dielectric layer 260 can be improved.

Figure 3:
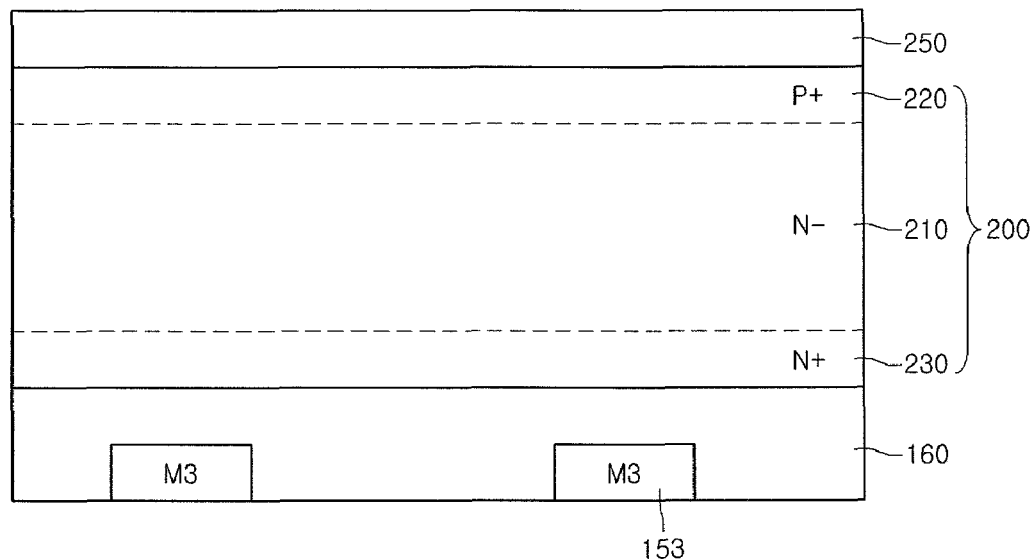

Thereafter, referring to example FIG. 3, a hard mask 250 is deposited over the photodiode 200. The hard mask 250 may be used as an etch mask in the subsequent etch process. The hard mask 250 may have a stacked structure of an oxide layer and a nitride layer.

For example, the hard mask 250 may include an ONO layer of a first oxide layer, a nitride layer formed over the first oxide layer, and a second oxide layer formed over the nitride layer.

Figure 4:
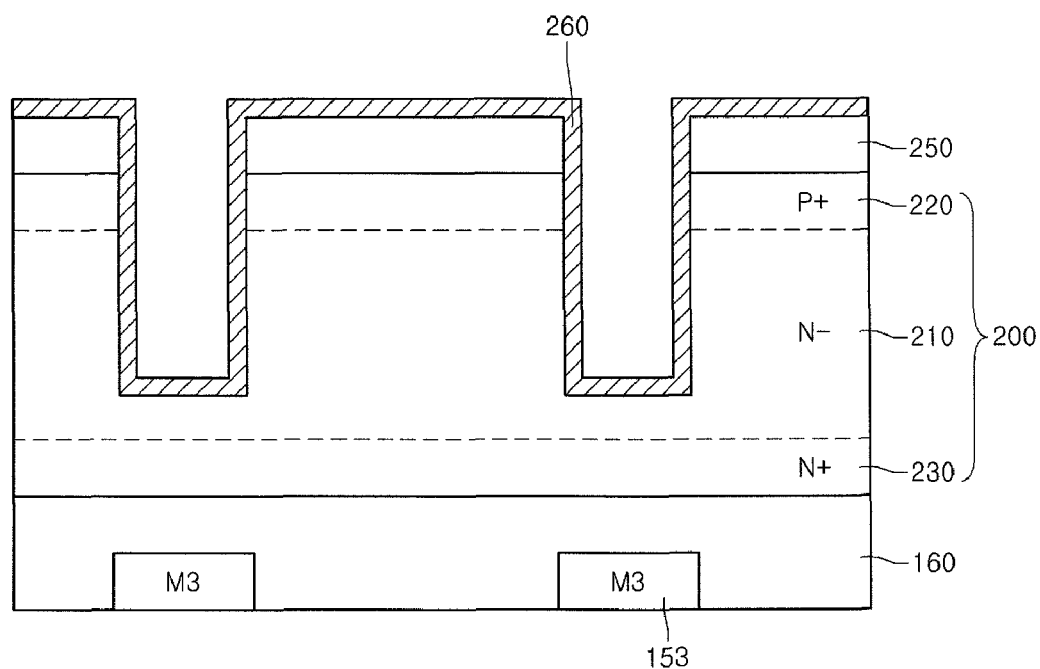

Then, referring to example FIG. 4, the hard mask 250 and the photodiode 200 may be etched corresponding to the third metal 153. Through the etch process, a hole (or a groove) may be formed to expose a lateral side of the second doped layer 220 of the photodiode 200.

During the first etch process for the photodiode 200, the lateral side of the second doped layer 220 constituting the photodiode 200 may be exposed, although the third doped layer 230 of the photodiode 200 may not be exposed. To this end, the first etch process may be performed with respect to the photodiode 200 by adjusting selectivity such that only portions of the hard mask 250, the second doped layer 220, and the first doped layer 210 are etched.

Then, after a portion of the photodiode 200 is etched corresponding to the third metal 153, a barrier layer 260 may be formed by using a material of insulating the exposed portion of the second doped layer 220. The barrier layer 260 isolates the second doped layer 220 from a first contact plug 270 which is described later. The barrier layer 260 may include an insulating layer such as an oxide layer or a nitride layer.

Figure 5:
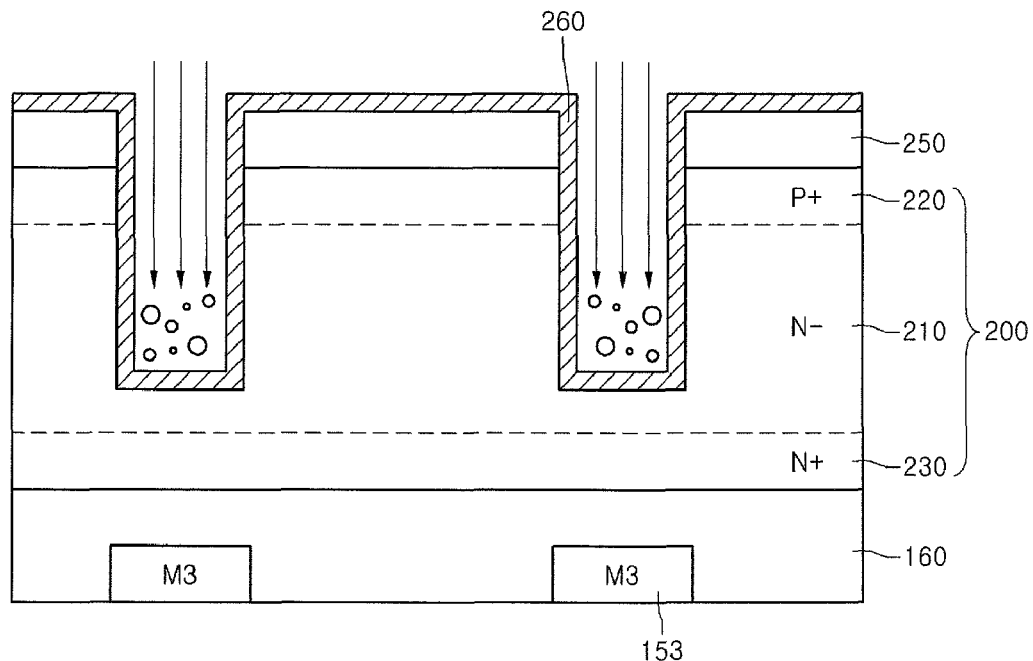

Thereafter, referring to example FIG. 5, after the barrier layer 260 has been formed in an opening of the photodiode 200, a process of forming a via hole is performed to expose a portion of the third metal 153 by expanding the opening of the photodiode 200. Through the process of forming the via hole to expose a portion of the third metal 153, a lower portion of the barrier layer 260 may be etched to form a barrier pattern 261 (see example FIG. 6).

In particular, the process of forming the via hole may be a second etch process for the photodiode 200. Through the second etch process, polymer is formed to protect sidewall silicon corresponding to the third doped layer 230 and the first doped layer 210. Since the sidewall protection scheme based on the polymer employs a byproduct generated in etching, the thickness of a sidewall may be reduced. This allows the size of the via hole to be significantly reduced.

The second etch process to expose a portion of the third metal 153 may be achieved through a byproduct capping mask (BCM) process using a byproduct generated in an etch process. The byproduct is a polymer byproduct as described above. BCM conditions using the polymer byproduct are as follows.

According to the BCM process, Ar gas, C5F8 gas, and O2 gas may be applied at a flow rate in a range of 120 sccm to 400 sccm, 12 sccm to 17 sccm, and 7 sccm to 12 sccm, respectively, under source power of about 900 W to 1100 W and bias power of 1300 W to 1700 W.

As a result, the process of forming a via hole to expose a portion of the third metal 153 includes the first etch process to expose a portion of the second doped layer 220 and the second etch process to expose a top surface of the third metal 153 by perforating the photodiode 200. The second etch process may be a BCM process using polymer generated in the etch process. Through the BCM process, silicon sidewalls can be protected, and the size of the via hole can be reduced.

Figure 6:
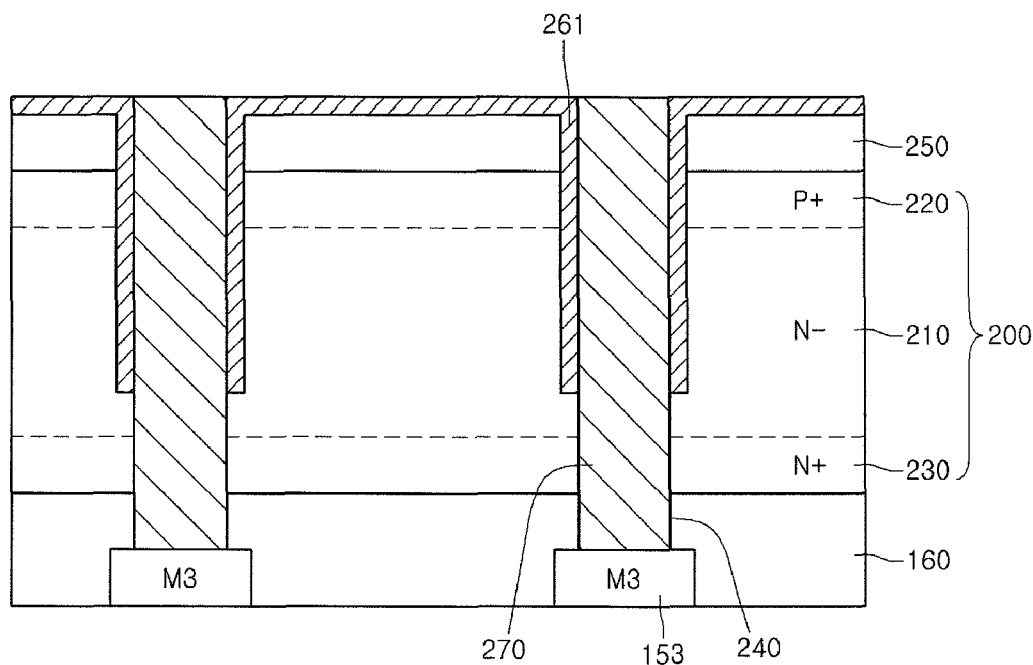

Next, referring to example FIG. 6, a first contact plug 270 is formed in the via hole to electrically connect the photodiode 200 with the circuitry 120. For example, the first contact plug 270 may include one of metallic materials such as copper (Cu), aluminum (Al), titanium (Ti), tantalum (Ta), Ti/Ti nitride (Ti/TiN), and tungsten (W).

The first contact plug 270 may be formed by performing a planarization process after performing a gap-fill process with respect to the opening of the hard mask 250 and the via hole 240. The first contact plug 270 is electrically connected to the third metal 153 by perforating the photodiode 200 and the interlayer dielectric layer 160 through the via hole 240. The barrier pattern 260 is partially formed over the lateral side of the first contact plug 270, so that the first contact plug 270 is electrically isolated from the second doped layer 220.

Accordingly, photo charges generated from the photodiode 200 are delivered to the circuitry 120 through the first contact plug 270. In addition, since the barrier pattern 260 electrically isolates the first contact plug 270 from the second doped layer 220, the photodiode 200 can normally operate.

Figure 7:
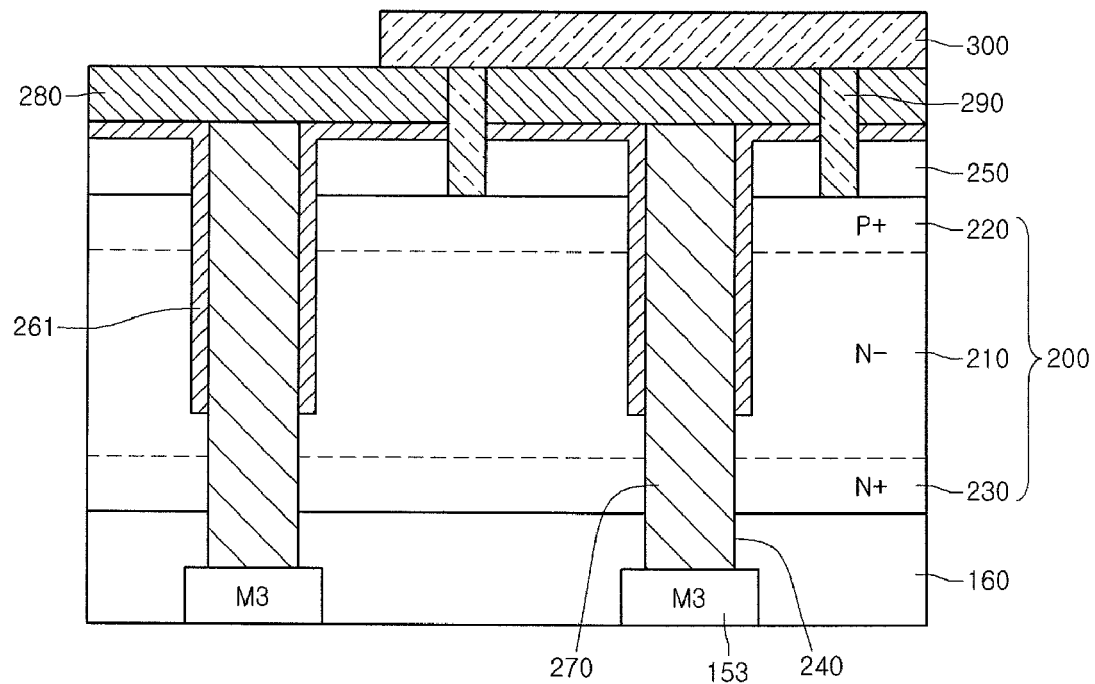

Then, referring to example FIG. 7, an insulating layer may be deposited over the hard mask 250 and the first contact plug 270 to form a second interlayer dielectric layer 280. After a photoresist has been coated over the second interlayer dielectric layer 280, the resultant structure may be patterned. Then, the second interlayer dielectric layer 280 and the hard mask 250 may be etched to form a via hole for a second contact plug 290. Next, the second contact plug 300 may be formed in the via hole. Thereafter, an upper electrode, or a color filter can be performed.

According to embodiments, when the photodiode is etched, an etch process is performed using a polymer byproduct, thereby protecting exposed silicon sidewalls. Especially, the size of the via hole for a contact plug can be reduced, so that a light receiving capability of the photodiode can be improved. Also, according to embodiments, when forming the via hole passing through a photodiode region and forming a barrier pattern in the via hole to insulate a portion of doped regions of the photodiode, the size of an upper opening of the via hole can be maintained. In addition, the opening of the via hole extending through the photodiode is ensured, so that the profile of the via hole can be endured even if a contact plug is formed in the subsequent process.

It will be obvious and apparent to those skilled in the art that various modifications and variations can be made in the embodiments disclosed. Thus, it is intended that the disclosed embodiments cover the obvious and apparent modifications and variations, provided that they are within the scope of the appended claims and their equivalents.

What is claimed is:

1. A method comprising:
    forming circuitry including a metal line over a semiconductor substrate;
    forming a photodiode over the metal line; and
    forming a contact plug in the photodiode such that the contact plug is connected to the metal line,
    wherein the forming of the contact plug includes:
        performing a first etch process to etch a portion of the photodiode; and
        performing a second etch process to expose a portion of the metal line, using a byproduct generated in the second etch process, to form a via hole for the contact plug in the photodiode.

2. The method of claim 1, further comprising a barrier layer to insulate an exposed surface of the photodiode after the first etch process has been performed.

3. The method of claim 2, wherein the second etch process is performed to etch a lower portion of the barrier layer, the photodiode, and an interlayer dielectric layer having the metal line.

4. The method of claim 1, wherein the second etch process is a byproduct capping mask process using a byproduct generated in the second etching process.

5. The method of claim 4, wherein the byproduct is a polymer.

6. The method of claim 4 wherein the byproduct protects the sidewalls of the via hole during the second etching process.

7. The method of claim 1, wherein the second etch process is performed using Ar gas, C5F8 gas, and O2 gas.

8. The method of claim 7, wherein the second etch process is performed under conditions of applying Ar gas at a flow rate in a range of 120 sccm to 400 sccm, C5F8 gas at a flow rate in a range of 12 sccm to 17 sccm, and O2 gas at a flow rate in a range of 7 sccm to 12 sccm.

9. The method of claim 8, wherein the second etch process is performed with source power of 900 W to 1100 W.

10. The method of claim 9, wherein the second etch process is performed with bias power of 1300 W to 1700 W.

11. A method comprising:
    forming a photodiode, including a first impurity region and a second impurity region over the first impurity region in a substrate, which is aligned over an interlayer dielectric layer having a metal line, through an ion implantation process;
    exposing a portion of the second impurity region of the photodiode by etching the photodiode;
    forming a barrier layer over the photodiode such that the barrier layer insulates the second impurity region;
    exposing a portion of the metal line by etching the photodiode and the interlayer dielectric layer; and
    forming a contact plug in the photodiode such that the contact plug is electrically connected to the metal line,
    wherein the portion of the metal line is exposed through a byproduct capping mask process using a byproduct generated in etching process of the photodiode and the interlayer dielectric layer.

12. The method of claim 11, wherein the photodiode has a PN junction by the first and second impurity regions, and wherein the portion of the second impurity region is exposed such that the first impurity region is not etched.

13. The method of claim 11, wherein the byproduct capping mask process is performed with respect to the first impurity region and the interlayer dielectric layer.

14. The method of claim 11, wherein the byproduct is a polymer.

15. The method of claim 14, wherein the byproduct protects the sidewalls of the via hole during the second etching process.

16. The method of claim 11, wherein the second etch process is performed using Ar gas, C5F8 gas, and O2 gas.

17. The method of claim 16, wherein the second etch process is performed under conditions of applying Ar gas at a flow rate in a range of 120 sccm to 400 sccm, C5F8 gas at a flow rate in a range of 12 sccm to 17 sccm, and O2 gas at a flow rate in a range of 7 sccm to 12 sccm.

18. The method of claim 17, wherein the second etch process is performed with source power of 900 W to 1100 W.

19. The method of claim 18, wherein the second etch process is performed with bias power of 1300 W to 1700 W.

20. The method of claim 11, wherein the contact plug includes at least one of copper, aluminum, titanium, tantalum, titanium nitride, and tungsten.

* * * * *